United States Patent [19]

Correale, Jr. et al.

[11] Patent Number: 5,042,034
[45] Date of Patent: Aug. 20, 1991

[54] BY-PASS BOUNDARY SCAN DESIGN

[75] Inventors: Anthony Correale, Jr., Raleigh; Richard M. Doney, Durham; Kim E. O'Donnell, Raleigh; Andrew Kegl, Raleigh; Erwin A. Tate, Raleigh, all of N.C.; David M. Wu, Melbourne, Fla.

[73] Assignee: International Business Machines Corporation, Armonk, N.Y.

[21] Appl. No.: 427,549

[22] Filed: Oct. 27, 1989

[51] Int. Cl.⁵ .................. G06F 11/00; G01R 31/28
[52] U.S. Cl. .................... 371/22.3; 371/22.4; 371/25.1
[58] Field of Search .............. 371/22.3, 22.4, 22.5, 371/22.1, 25.1, 15.1; 324/73.1, 158 R

[56] References Cited

U.S. PATENT DOCUMENTS

| | | | |
|---|---|---|---|
| 4,503,537 | 3/1985 | McAnney | 371/25 |
| 4,513,418 | 4/1985 | Bardell et al. | 371/25 |
| 4,519,078 | 5/1985 | Komonytsky | 371/25 |
| 4,698,588 | 10/1987 | Hwang et al. | 324/73 |
| 4,724,380 | 2/1988 | Burrows et al. | 324/73 |
| 4,754,215 | 6/1988 | Kawai | 324/73 |
| 4,764,926 | 8/1988 | Knight et al. | 371/25 |
| 4,855,669 | 8/1989 | Mahoney | 371/22.3 X |
| 4,875,003 | 10/1989 | Burke | 371/25.1 X |
| 4,945,536 | 7/1990 | Hancu | 371/22.3 |

OTHER PUBLICATIONS

F. Beenker, "Systematic and Structured Methods for Digital Board Testing," IEEE International Conference, 1/1985, pp. 380-385.

L. Whetsel, "A Standard Test Bus and Boundary Scan Architecture", TI Tech. Journal, 7/1988, pp. 48-59.
C. Gloster, "Boundary Scan with Built-In Self-Test" IEEE Design & Test, 2/1989, pp. 36-44.

Primary Examiner—Robert W. Beausoliel
Attorney, Agent, or Firm—Blaney Harper; J. C. Cockburn; M. H. Klitzman

[57] ABSTRACT

The present invention implements self testable boundary logic by using a tristate pass gate and a tristate receiver in combination with a linear feedback shift register, a storage register, and level sensitive scan design (LSSD) techniques. The linear feedback shift register (LFSR) shifts data into a storage register which is connected to the data inputs of the boundary logic through the tristate pass gate. The outputs of the tristate input receiver are also connected to the inputs of the boundary logic so that the boundary logic can receive data from both the data input of the integrated circuit (data path) or from the storage register connected to the LFSR. The tristate pass gate and receiver are enabled through a self test signal such that when the pass gate is enabled the receiver is not enabled and vice versa. In this way the boundary logic can only get data from either the storage register or through the receiver but not both. In this configuration data from the storage register can be input into the boundary logic without going through a multiplexer in the data path and incurring the associated delay. The boundary logic can then be self tested using ordinary LSSD techniques. This self testing can also be performed with a minimum of additional silicon area being used for the self test structures.

5 Claims, 3 Drawing Sheets

BY-PASS BOUNDARY SCAN DESIGN

FIELD OF THE INVENTION

This invention relates to the field of self testing very large scale integrated circuits. More particularly, this invention relates to self testing boundary logic within very large scale integrated circuits using level sensitive scan design techniques.

BACKGROUND OF THE INVENTION

Integrated circuit density has increased rapidly in recent years. The increase in density has been coupled with the requirement of developing test techniques that adequately test such high densities. One such technique for testing integrated circuits is called level sensitive scan design (LSSD) testing and is described by E. B. Eichelberger and T. W. Williams in an article entitled "A Logic Design Structure for LSI Testability" on pages 462-468 of the proceedings of the 14th Design Automation Conference. Basically, LSSD utilizes a plurality of control and observation points (typically implemented as a shift register string) within an integrated circuit (or board level) structure. The integrated circuit can perform self test by feeding data into a specifically configured shift register having feedback to generate data test patterns. This shift register string is referred to as a linear feedback shift register or pseudo random pattern generator. The data is allowed to shift through the Linear Feedback Shift Register (LFSR) for a defined number of scan clock cycles to generate pseudo random test data. As the pseudo random data shifts through the LFSR, pseudo random data also scans into the scan chains (storage registers) of the integrated circuit. The storage registers function as inputs into the logic of the integrated circuit to be tested. A data clock signal is issued to the logic sections, and as a result, the logic sections output test data is captured by additional storage registers. This captured data is then scanned into a Multiple Input Shift Register (MISR). The MISR stores this captured data. As the captured data is scanned into the MISR, the LFSR is generating new pseudo random data which is being scanned into the scan chains. This cycle is repeated until the test is complete with the resultant stored data forming a signature to be compared against a known signature or value. A determination of the functionality of the integrated circuit can then be made because of the comparison of the signature to a known value. This self testing technique has been described in "LSI Self-Test Using Level Sensitive Scan Design and Signature Analysis" by Donald Komonytsky, IEEE 1982 International Test Conference, Digest of Papers, pages 414-424, and in "Self-Testing of Multiple Chip Modules" by Paul H. Bardell and William H. McAnney, 1982 International Test Conference, Digest of Papers, pages 200-204.

This technique is not, however, available to some parts of the integrated circuit structure because some logic cannot be directly stimulated by on board (or circuit) registers or the output of some logic cannot be captured by on board (or circuit) registers. This logic is typically the input/output logic associated with the drivers and receivers of the integrated circuit. This logic is generally referred to as boundary logic and typically requires a separate technique (referred to as boundary scan) to provide test coverage of the boundary logic between the primary input and the first LSSD shift register string and also between the final LSSD shift register string and the primary output.

One solution to this problem has been to place a multiplexer after the receiver of the integrated circuit but before the boundary logic in the data path. FIG. 1 illustrates this prior art approach. The integrated circuit 10 receives data through primary inputs 130 connected to a receiver 180. The output of the receiver 180 is connected to the input of a multiplexer 190. The output of a storage register 50 is also connected to the input of the multiplexer 190. The multiplexer is controlled by the self test signal 110 which switches the source of the data to the input boundary logic 20 between the receiver 180 and the storage register 50. The storage register 50 receives its input from a linear feedback shift register (LFSR) 30 which generates the test pattern for the internal logic 128 and the input boundary logic 20.

Either test or input data can then be sent to the boundary logic through the multiplexer. The multiplexer would toggle between sending test or input data to the boundary logic in response to a self test signal. The primary difficulties with this solution is that a multiplexer occupies a relatively large amount of expensive silicon area on the chip. More importantly, the multiplexer also introduces a delay of at least several nanoseconds into the data path. This delay will always exist because the multiplexer is part of the data path itself. Several nanoseconds of delay can be a very significant performance problem with many logic structure and this delay becomes increasingly more important as circuit performance increases. Finally, this solution does not address the problem of testing the output boundary logic because the multiplexer does not affect the data flow into or out of the output boundary logic.

OBJECTS

It is the object of this invention to improve the self test means of an integrated circuit.

It is a further object of this invention to improve the self test means for boundary logic circuits.

It is still a further object of this invention to provide an improve the self test means for both input and output boundary logic circuits.

It is still a further object of this invention to provide an improved self test means for boundary logic which does not impede the performance of the logic circuits.

It is still a further object of this invention circuits. improve the self test means to boundary logic which requires a minimum of silicon area.

SUMMARY OF THE INVENTION

The present invention implements self testable boundary logic by using a tristate pass gate and a tristate receiver in combination with a linear feedback shift register, a storage register, and level sensitive scan design (LSSD) techniques. The linear feedback shift register (LFSR) scans data into a storage register which is connected to the data inputs of the boundary logic through the tristate pass gate. Scanning data into a register refers to the process of feeding data to that register through a series of serially connected gates or latches. Data is fed in one end of the series, and a clock pulse shifts the data through gates in the series until the data is finally shifted out into the register. The outputs of the tristate input receiver are also connected to the inputs of the boundary logic so that the boundary logic can receive data from either the data input of the integrated circuit (data path) or from the storage register connected to the LFSR. The tristate pass gate and receiver are enabled through a self test signal such that when the pass gate is enabled the receiver is not enabled and vice versa. In this way the boundary logic can only get data from either the storage register or through the receiver but not both. In this configuration, data from the storage register can be input into the boundary logic without going through a multiplexer in the data path and incurring the associated delay. The boundary logic is then testable. This self testing can also be performed with a minimum of additional silicon area being used for the self test structures. An alternate embodiment of this invention is also disclosed in which the added storage register connected to the LFSR is replaced by an existing storage register which is normally used in LSSD testing of internal logic. The output of this storage register is fed through the tristate pass gate as in the first embodiment. Again, as in the first embodiment, the boundary logic receives its input from either the storage register, redefined from the first embodiment in this alternate embodiment, or through the primary inputs. The resulting integrated circuit is still self testable without the delay or silicon area waste of the multiplexer.

PREFERRED EMBODIMENT

Figure 1:
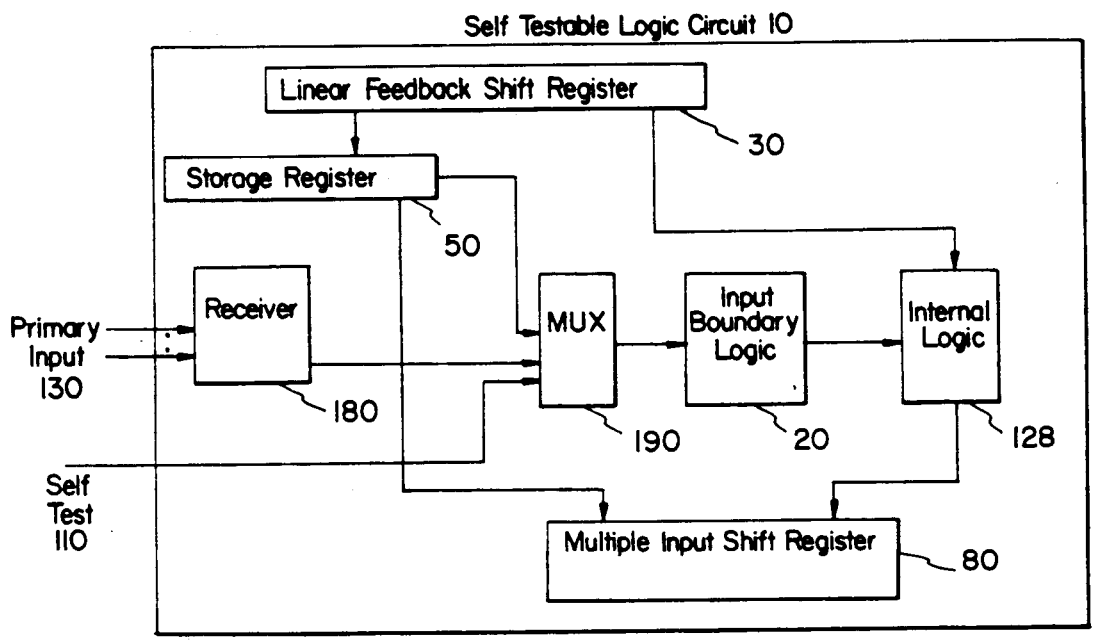
FIG. 1 illustrates an integrated circuit having a self test capability according to the prior art.
Figure 2:
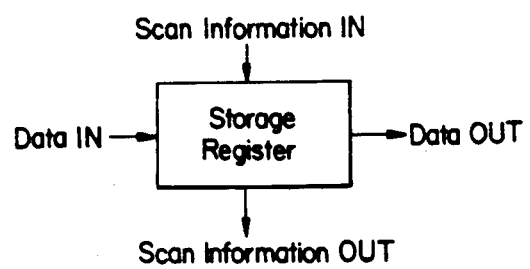
FIG. 2 illustrates information flow into and out of FIGS. 3 and 4.
Figure 3:
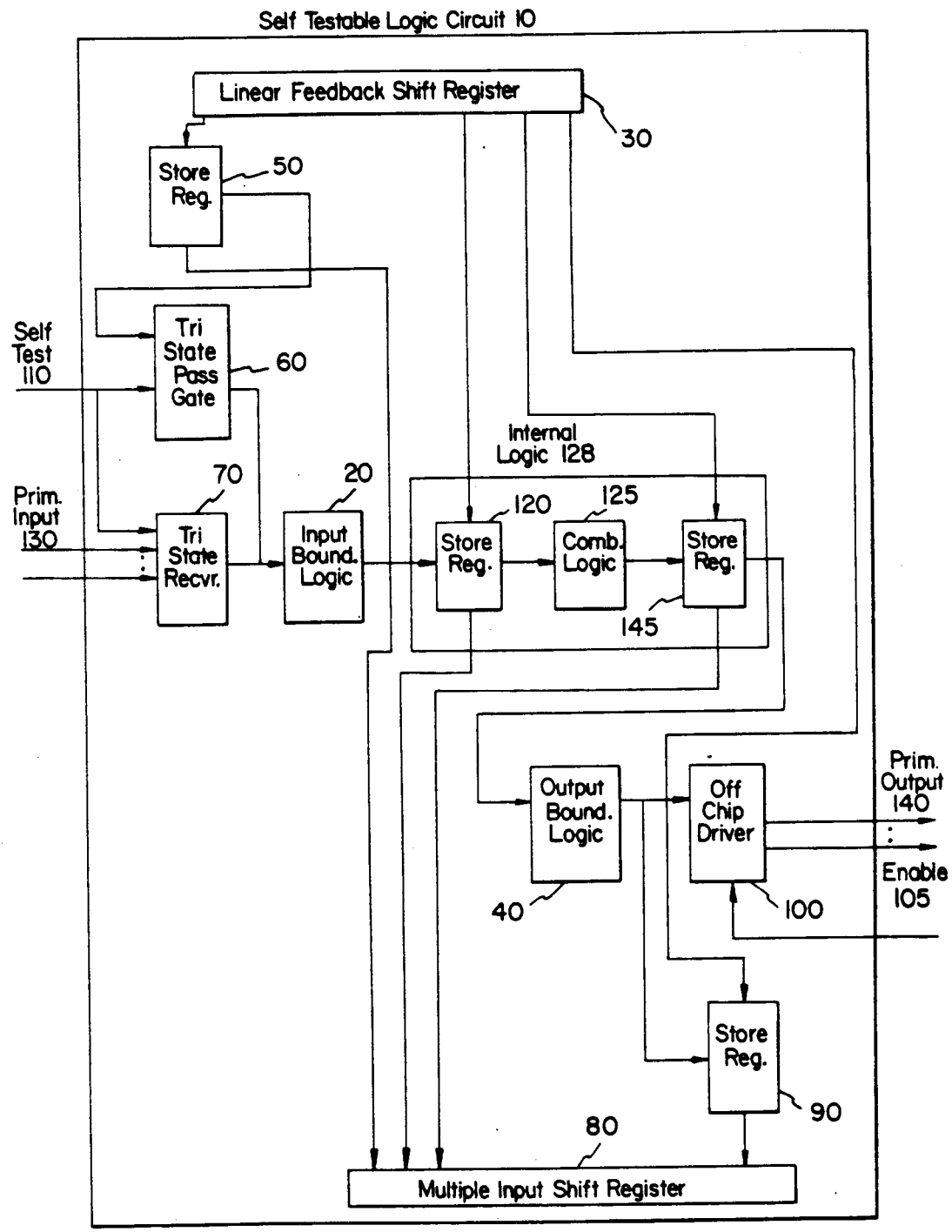
FIG. 3 illustrates an integrated circuit having a self test capability according to the present invention.

FIG. 3 illustrates a preferred embodiment of the present invention. FIG. 2 illustrates the manner in which the elements of FIGS. 3 and 4, the tristate pass gate 60, the tristate receiver 70, the storage registers 50, 120, 145, and 90, and the off chip driver 100, distribute information. Information flowing into the top and out of the bottom of the register is scan information used in the self-test mode (or normal LSSD test mode), and information flowing into the left side and out of the right side of the register is data used in the normal mode of operation of the integrated circuit. Information entering a register as scan information can be treated as data when it exits from the register. An integrated circuit 10 contains input boundary logic 20 and output boundary logic 40. This input and output boundary logic is distinct from combinatorial logic 125 because the output of the third storage register 120 cannot stimulate the input of the input boundary logic 20 and the output of the output boundary logic cannot be fed into the fourth storage register 145. The combination of the third storage register 120, the fourth storage register 145, and the combinatorial logic 125 is referred to as internal logic 128. The input of the input boundary logic 20 is connected to the output of a tristate pass gate 60 and a tristate receiver 70. A tristate pass gate is one in which the output of the pass gate can be set, typically through a control signal, to a high impedance state. Similarly, a tristate receiver is a receiver in which the receiver output can be set to a high impedance state. The high impedance state of both the receiver 70 and the pass gate 60 are controlled by a single self test signal 110 in this case. The responses of the pass gate 60 and the receiver 70 to the self test signal 110 are coordinated with respect to each other. This coordination is such that when the self test signal 110 sets the output of the pass gate 60 to its high impedance state, by being in a first state (either high or low), the self test signal 110 also causes the outputs of the receiver 70 to become responsive to input data from the data path. Therefore, data is passed from the primary inputs 130 to the input boundary logic 20. Similarly, the pass gate 60 and the receiver 70 are coordinated, with respect to each other and the self test signal, so that when the self test signal sets the outputs of the receiver 70 to a high impedance state, by being in a second state (either low or high), the same self test signal 110 also activates the outputs of the pass gate 60. This, in turn, enables information from a first storage register 50 to be passed, along the test path, through to the input boundary logic 20. The storage register 50 passes scan information to the MISR 80, as well as passing data directly to the pass gate 60. This coordination results in the input boundary logic 20 only receiving data from either the data path or the test path, but not receiving data from both paths at once or not receiving data at all, because the self test control signal can only be high or low.

The output of the input boundary logic 20 is fed to a third storage register 120. This third storage register 120 is also connected to a multiple input shift register (MISR) 80, to the combinatorial logic 125, and to a linear feedback shift register (LFSR) 30. The LFSR 30 is also referred to as a pseudo random pattern generator. The third storage register 120 is used to capture and pass the flow of data and scan information from the input boundary logic 20 and LFSR 30 to the internal logic 125 and to the MISR 80. The internal logic 125 receives data from the third storage register 120 and performs the principle logic functions of the integrated circuit 10. The results of this logic are then stored in a fourth storage register 145. The fourth storage register 145 is used to capture and pass the flow of data from the internal logic 125 to the output boundary logic 40 and to capture and pass the flow of scan information to the MISR 80. The output boundary logic 40 receives data from a fourth storage register 145 and passes it to both an off chip driver (OCD) 100 and a second storage register 90. The OCD 100 passes the data from the integrated circuit 10, through the primary outputs 140 to another circuit when the enable signal 105 indicates that valid data can be passed off the integrated circuit 10. The second storage register 90 receives data from the output boundary logic 40 and test pattern scan information from the LFSR 30. The second storage register 90 is also one of the multiple inputs to the MISR 80 along with the first 50, third 120, and fourth 145 storage registers.

The integrated circuit 10 is tested by having the self test signal set to a first state (either high or low) which allows a seed pattern of data to be serially fed to the LFSR 30 and MISR 80 through an input line not shown. The LFSR 30 generates a random pattern of data by serially shifting the seed pattern, out one end and back in the other end of the shift register, repetitively. This is a conventional method of generating a test pattern of scan information for logic and is why the LFSR 30 is also called a pseudo random pattern generator. The self test signal 110 is reset to a second state (either low or high) indicating that the integrated circuit is in test mode. The scan information test patterns from the LFSR 30 are scanned into the third storage register 120 and subsequently used as input to the combinatorial logic 125. The output of the combinatorial logic 125 test results are captured by the fourth storage register 145 and are scanned out to the MISR 80. Through out the test, the MISR 80, accumulates the test results. The cycle of generating pseudo random data, testing, and accumulating results in the MISR, is repeated several times within a test. The accumulated test results form a signature when the test is completed. This signature is compared to a known good signature (or value) for the given logic design. The comparison of signatures determines the functionality of the logic circuit.

In addition to scanning the random test pattern to the third storage register 120, the LFSR 30 also scans the test pattern to a first storage register 50. This storage register then passes the data through the pass gate 60 to the input boundary logic 20. Since the self test line is reset to a second state, the outputs of the receiver 70 are in a high impedance state and the input logic 20 receives test pattern scan information through the enabled pass gate 60. The test pattern stimulates the input boundary logic and the results of the boundary logic are captured (in response to a data clock) in the third storage register 120. The third storage register 120 loads the test pattern from the LFSR 30 into the internal logic 125 before it receives the results of the input boundary logic. The third storage register 120 then scans the results generated by the input boundary logic 20 out to the MISR 80. The results of the input boundary logic are now a part of the data pattern that is shifted out by the MISR 80 to be compared along with other integrated circuit data against a known signature. Therefore, the input boundary logic is being tested at the same time and with the same techniques as the internal logic without any delay introduced into the data path of the integrated circuit.

Similarly, the output boundary logic is tested by having the test pattern information scanned from the LFSR 30 into the fourth storage register 145. The output boundary logic receives this test pattern and generates its results. The result is captured in the second storage register 90 and subsequently scanned out to the MISR 80. These results of the output boundary logic now are another part of the data pattern shifted out of the MISR 80, as are the results of the input boundary logic and the internal logic. Therefore all the logic components on the integrated circuit can be tested at the same time and by the same techniques which simplifies the testing process.

Figure 4:
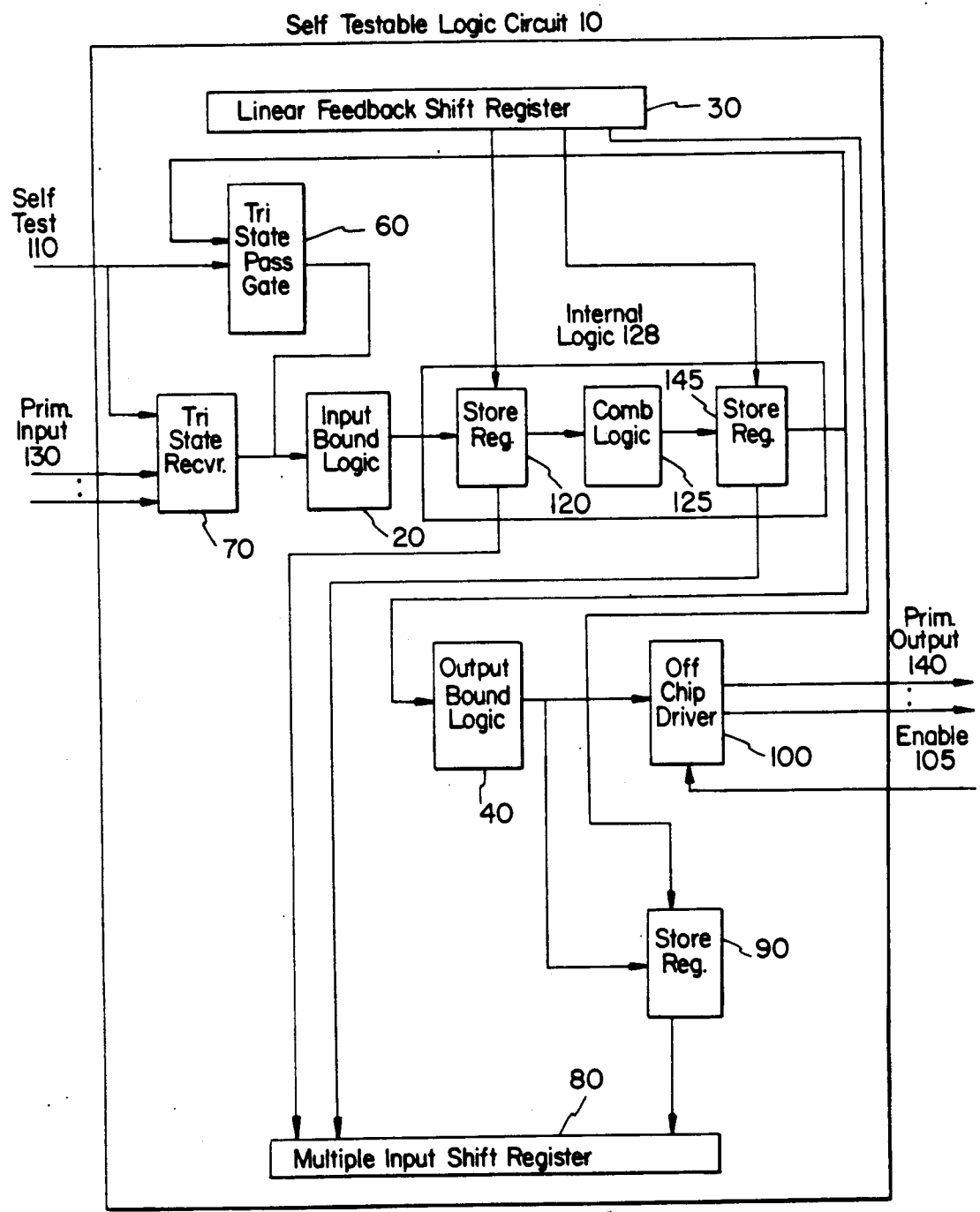
FIG. 4 illustrates an alternate embodiment of an integrated circuit having self test capability according to the present invention.

An alternate embodiment of the present invention is shown in FIG. 4. This embodiment is similar to the first embodiment except that instead of using the first storage register 50 of the first embodiment as the source of the test pattern scan information for the input boundary logic 20, this second embodiment uses the fourth storage register 145 as the source. Here, the fourth storage register 145 loads test results (referred to as scan information) from the internal logic 125 into the MISR 80 before the test pattern from the LFSR 30 is stored in the fourth storage register 145. The test pattern stored in the fourth storage register 145 is be used to stimulate both the output and input boundary logic. In this embodiment, the LFSR 30 scans the test pattern data into the fourth storage register 145 which is connected to the pass gate 60, the output boundary logic, and the MISR 80. The test pattern is sent to the input boundary logic 20 via the pass gate 60 and to the output boundary logic 40. The results from the input boundary logic 20 are captured by the storage register 120 and the results of the output boundary logic 40 are captured by the storage register 90. Registers 90 and 120 then scan the results into the MISR 80 as in the first embodiment. Also, the third storage register 120 loads the test pattern from the LFSR 30 into the combinatorial logic 125 before the scan information from the input boundary logic 20 is loaded into the third storage register 120. Again, as in the first embodiment, scan information from the third 120, second 90, and fourth 145 storage registers is sent to the MISR 80 for comparison with an established data signature.

While this invention has been particularly described and illustrated with references to plural embodiments thereof, it will be understood by those skilled in the art that changes in the above description or illustrations may be made with respect to form of detail without departing from the spirit or scope of the invention.

We claim:

1. A self testable logic circuit comprising:
a linear feedback shift register for generating test pattern scan information;
internal logic which receives test pattern scan information from said linear feedback shift register;
a multiple input shift register which receives scan information from said internal logic;
a tristate pass gate having inputs connected to outputs of said internal logic so as to receive test data from said internal logic;
input boundary logic having outputs connected to inputs of said internal logic;
a tristate receiver having outputs connected to inputs of said input boundary logic;
said tristate pass gate having outputs connected to inputs of said input boundary logic;
said tristate receiver outputs being enabled when a self test signal is in a first state, said tristate receiver outputs set to a high impedance state when said self test signal is in a second state;
said tristate pass gate outputs being enabled when said self test signal is in said second state, said tristate pass gate outputs set to a high impedance state when said self test signal is in said first state;
said input boundary logic receiving test pattern scan information from said linear feedback shift register through said internal logic and said tristate pass gate when said self test signal is in said second state;
said input boundary logic receiving data from said tristate receiver when said self test signal is in said first state; and
said scan information in said multiple input shift register indicates the functionality of said self testable logic circuit when said self test signal is in said second state.

2. A self testable logic circuit as in claim 1, further comprising:
output boundary logic, a storage register, and an off chip driver;
said internal logic being connected to said output boundary logic and transmitting data to said output boundary logic;
said output boundary logic being connected to said storage register and said off chip driver;
said storage register being connected to said multiple input shift register;
said output boundary logic transmitting scan information to said multiple input shift register through said storage register when said self test signal is in said second state; and said output boundary logic transmitting data to said off chip driver when said self test signal is in said first state.

3. A self testable logic circuit comprising:

a linear feedback shift register for generating test pattern scan information;

internal logic which receives test pattern scan information rom said linear feedback shift register;

a multiple input shift register which receives scan information from said internal logic;

input boundary logic having outputs connected to inputs of said internal logic;

a tristate receiver having outputs connected to inputs of said input boundary logic;

a first storage register when receives test pattern scan information from said linear feedback shift register and sends said test pattern scan information to said multiple input shift register;

a tristate pass gate having inputs connected to outputs of said first storage register;

said tristate pass gate having outputs connected to inputs of said input boundary logic;

said tristate receiver outputs being enabled when a self test signal is in a first state, said tristate receiver outputs set to a high impedance state when said self test signal is in a second state;

said tristate pass gate outputs being enabled when said self test signal is in said second state, said tristate pass gate outputs set to a high impedance state when said self test signal is in said first state;

said input boundary logic receiving test pattern scan information from said linear feedback shift register through said first storage register and said tristate pass gate when said self test signal is in said second state;

said input boundary logic receiving data from said tristate receiver when said self test signal is in said first state; and said scan information in said multiple input shift register indicates the functionality of said self testable logic circuit when said self test signal is in said second state.

4. A self testable logic circuit as in claim 3, further comprising:

output boundary logic, a second storage register, and an off chip driver;

said internal logic being connected to said output boundary logic and transmitting data to said output boundary logic;

said output boundary logic being connected to said second storage register and said off chip driver;

said second storage register being connected to said multiple input shift register;

said output boundary logic transmitting scan information to said multiple input shift register through said second storage register when said self test signal is in said second state; and said output boundary logic transmitting data to said off chip driver when said self test signal is in said first state.

5. A method of testing self testable logic circuits comprising:

generating test pattern scan information in a linear feedback shift register;

applying said test pattern scan information to internal logic, and input boundary logic;

prohibiting said test pattern scan information from application to said input boundary logic when a self test signal is in a first state, said prohibition providing no transmission delay between a receiver and said input boundary logic;

said test pattern scan information being applied to said input boundary logic through a tristate pass gate when self test signal is in a second state;

sampling scan information from said internal logic and said input boundary logic, said sampled scan information being stored in a multiple input shift register; and comparing said sampled test data with signature test data results to determine said self testable logic circuit functional performance.

* * * * *